United States Patent
Hao et al.

(10) Patent No.: US 9,184,163 B1
(45) Date of Patent: Nov. 10, 2015

(54) LOW COST TRANSISTORS

(71) Applicant: Texas Instruments Incorporated, Dallas, TX (US)

(72) Inventors: Pinghai Hao, Plano, TX (US); Sameer Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/803,678

(22) Filed: Jul. 20, 2015

Related U.S. Application Data (62) Division of application No. 14/101,442, filed on Dec. 10, 2013, now Pat. No. 9,117,691.

(60) Provisional application No. 61/747,001, filed on Dec. 28, 2012.

(51) Int. Cl.
| | |
|---|---|
| *H01L 27/092* | (2006.01) |
| *H01L 29/36* | (2006.01) |
| *H01L 29/78* | (2006.01) |
| *H01L 29/10* | (2006.01) |
| *H01L 27/088* | (2006.01) |

(52) U.S. Cl.
CPC .......... *H01L 27/0922* (2013.01); *H01L 27/088* (2013.01); *H01L 29/1095* (2013.01); *H01L 29/36* (2013.01); *H01L 29/7835* (2013.01)

(58) Field of Classification Search
CPC ...................... H01L 21/823807; H01L 27/092
USPC ........................................................ 438/291
See application file for complete search history.

(56) References Cited

U.S. PATENT DOCUMENTS

| | | | |
|---|---|---|---|
| 5,073,512 A | 12/1991 | Yoshino | |
| 5,082,794 A * | 1/1992 | Pfiester et al. | 438/289 |
| 5,270,234 A | 12/1993 | Huang et al. | |
| 5,413,945 A | 5/1995 | Chien et al. | |
| 5,472,897 A * | 12/1995 | Hsu et al. | 438/291 |
| 5,534,449 A | 7/1996 | Dennison et al. | |
| 5,904,530 A * | 5/1999 | Shin | 438/291 |
| 6,083,783 A | 7/2000 | Lin et al. | |
| 6,258,645 B1 | 7/2001 | Kang | |
| 6,297,132 B1 * | 10/2001 | Zhang et al. | 438/514 |
| 6,417,550 B1 * | 7/2002 | Madurawe et al. | 257/408 |
| 6,468,852 B1 | 10/2002 | Gonzalez et al. | |
| 6,586,294 B1 | 7/2003 | Post et al. | |
| 6,677,646 B2 * | 1/2004 | Ieong et al. | 257/347 |
| 6,762,086 B2 | 7/2004 | Oh | |
| 7,416,949 B1 | 8/2008 | Pas et al. | |
| 2007/0099369 A1 * | 5/2007 | Ning | 438/199 |
| 2007/0298557 A1 * | 12/2007 | Nieh et al. | 438/197 |
| 2008/0293204 A1 * | 11/2008 | Nieh et al. | 438/291 |

* cited by examiner

*Primary Examiner* — Lex Malsawma
(74) *Attorney, Agent, or Firm* — Jacqueline J. Garner; Frank D. Cimino (57) ABSTRACT

An integrated circuit containing an analog MOS transistor has an implant mask for a well which blocks well dopants from two diluted regions at edges of the gate, but exposes a channel region to the well dopants. A thermal drive step diffuses the implanted well dopants across the two diluted regions to form a continuous well with lower doping densities in the two diluted regions. Source/drain regions are formed adjacent to and underlapping the gate by implanting source/drain dopants into the substrate adjacent to the gate using the gate as a blocking layer and subsequently annealing the substrate so that the implanted source/drain dopants provide a desired extent of underlap of the source/drain regions under the gate. Drain extension dopants and halo dopants are not implanted into the substrate adjacent to the gate.

7 Claims, 8 Drawing Sheets

LOW COST TRANSISTORS

CROSS-REFERENCE TO RELATED APPLICATIONS

This application is a divisional of U.S. Nonprovisional patent application Ser. No. 14/101,442, filed Dec. 10, 2013, which claims the priority of U.S. provisional application Ser. No. 61/747,001, filed Dec. 28, 2012, the contents of both of which are herein incorporated by reference in its entirety.

FIELD OF THE INVENTION

This invention relates to the field of integrated circuits. More particularly, this invention relates to metal oxide semiconductor (MOS) transistors in integrated circuits.

BACKGROUND OF THE INVENTION

Integrated circuits with more and more functionality are needed to make advanced devices. Often multiple types of transistors such as logic MOS transistors, memory MOS transistors, input/output MOS transistors, high voltage MOS transistors and analog MOS transistors are needed on the same integrated circuit.

Analog MOS transistors may operate at higher voltages than logic MOS transistors. To form a reliable higher voltage MOS transistor in an integrated circuit typically requires sufficient overlap between the high voltage gate and high voltage drain diffusion to reduce the peak electric field near the gate corner in order to provide sufficient channel hot carrier CHC) reliability. Sufficient overlap is commonly provided by source/drain extensions which extend under the high voltage gate. Halo implants, which are angled implants of an opposite doping polarity from the source/drain extensions, may be used on logic MOS transistors to combat short channel effects. Halo implants may produce a significant slope in the drain voltage versus drain voltage curve of a MOS transistor, which may not be a problem for logic MOS transistors but may present a serious problem for analog MOS transistors. A slope as close to zero as possible may desirable for analog MOS transistors. Thus, analog MOS transistors may be added to the integrated circuit by adding separate photolithography and implantation steps to form source and drain extensions without halo implants. The additional photolithography and implantation steps undesirably increase the fabrication cost of the integrated circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing an analog MOS transistor may be formed by forming an implant mask for a well containing the analog MOS transistor, in which the implant mask blocks well dopants from two diluted regions but exposes a channel region to the well dopants. After the well dopants are implanted into a substrate of the integrated circuit, a thermal drive step diffuses the implanted well dopants across the two diluted regions to form a continuous well with lower doping densities in the source/drain extension regions. A gate dielectric layer and a gate of the analog MOS transistor are subsequently formed on the substrate over the well. Source/drain regions are formed adjacent to and underlapping the gate by implanting source/drain dopants into the substrate adjacent to the gate using the gate as a blocking layer and subsequently annealing the substrate so that the implanted source/drain dopants provide a desired extent of underlap of the source/drain regions under the gate. Drain extension dopants and halo dopants are not implanted into the substrate adjacent to the gate.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing an analog MOS transistor may be formed by forming an implant mask for a well containing the analog MOS transistor, in which the implant mask blocks well dopants from two diluted regions but exposes a channel region to the well dopants. After the well dopants are implanted into a substrate of the integrated circuit, a thermal drive step diffuses the implanted well dopants across the two diluted regions to form a continuous well with a doping density under the channel region so as to provide a desired threshold voltage for the analog MOS transistor, and with lower doping densities in the two diluted regions. A gate dielectric layer and a gate of the analog MOS transistor are subsequently formed on the substrate over the well. Source/drain regions are formed adjacent to and underlapping the gate by implanting source/drain dopants into the substrate adjacent to the gate using the gate as a blocking layer and subsequently annealing the substrate so that the implanted source/drain dopants diffuse into the lighter doped two diluted regions and provide a desired extent of underlap of the source/drain regions under the gate. Drain extension dopants and halo dopants are not implanted into the substrate adjacent to the gate.

The source/drain dopants may be implanted concurrently into other MOS transistors such as logic MOS transistors which do not have diluted regions in wells. The implanted source/drain dopants in these MOS transistors form source drain regions which do not extend as far under their respective gates. Forming the analog MOS transistor with this process may provide desired values of threshold voltage and slope in the drain voltage versus drain voltage, and advantageously provide lower fabrication cost of the integrated circuit compared to a process sequence using a dedicated source/drain implant step for the analog MOS transistor. The well of the analog MOS transistor may be formed concurrently with a drain region of an extended drain MOS transistor of an opposite polarity from the analog MOS transistor, further reducing the fabrication cost compared to a process sequence using a dedicated implant for the well.

Figure 1:
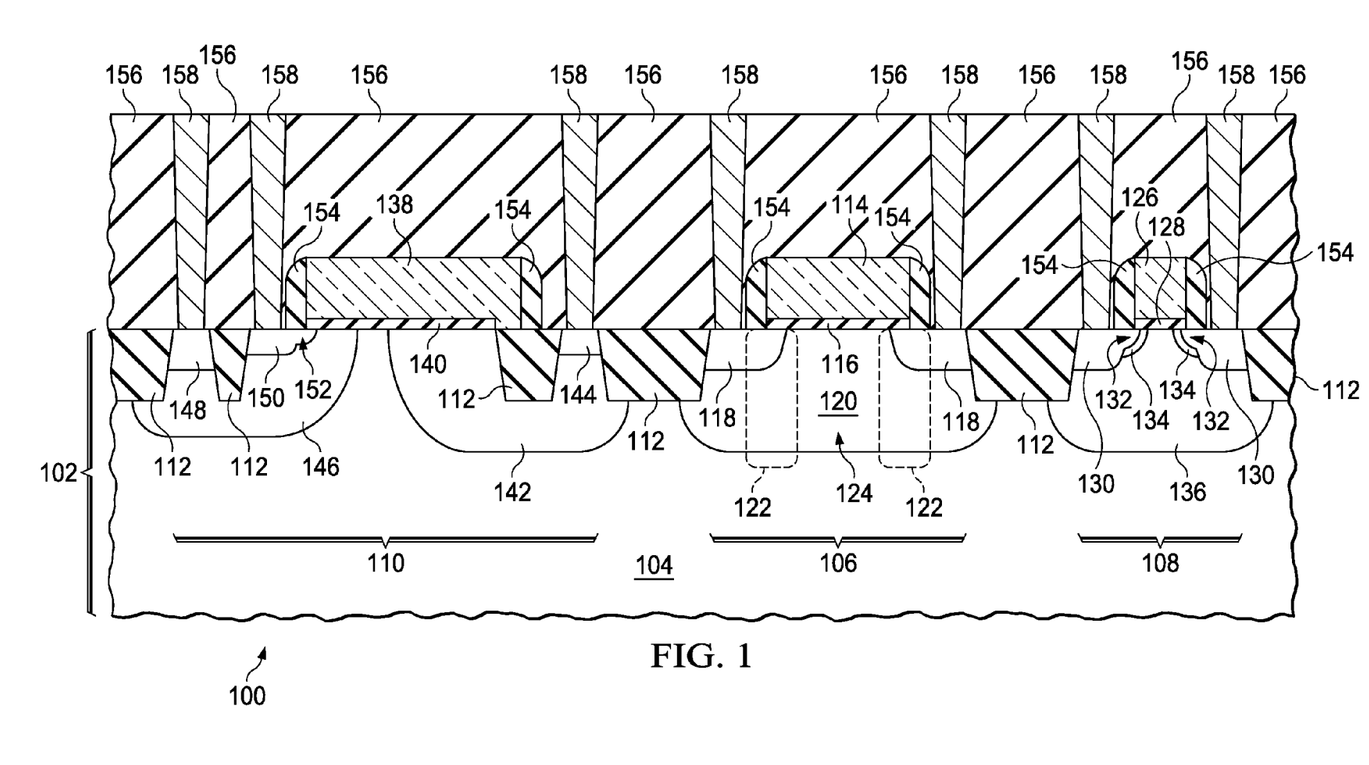
FIG. 1 is a cross section of an example integrated circuit containing an analog MOS transistor and an extended drain MOS transistor having an opposite polarity from the analog MOS transistor.

FIG. 1 is a cross section of an example integrated circuit containing an analog MOS transistor and an extended drain MOS transistor having an opposite polarity from the analog MOS transistor. The integrated circuit 100 is formed in and on a substrate 102 which includes semiconductor material 104 extending to a top surface. The semiconductor material 104 may be p-type or n-type, and have a bulk resistivity of, for example, 2 ohm-cm to 100 ohm cm. The semiconductor material 104 may be epitaxial material over a more heavily doped substrate. The integrated circuit 100 includes an analog MOS transistor 106. The integrated circuit 100 may possibly include a logic MOS transistor 108 of the same polarity as the analog MOS transistor 106. The integrated circuit 100 may possibly include an extended drain MOS transistor 110 of an opposite polarity from the analog MOS transistor 106. The instant example will be described for a p-channel polarity of the analog MOS transistor 106 and the logic MOS transistor 108 and an n-channel polarity of the extended drain MOS transistor 110. The p-channel analog MOS transistor 106 and logic MOS transistor 108 and the n-channel extended drain MOS transistor 110 may be formed with either a p-type conductivity semiconductor material 104 or an n-type conductivity semiconductor material 104. It will be recognized that an n-channel polarity version of the analog MOS transistor 106 and logic MOS transistor 108 and a p-channel polarity version of the extended drain MOS transistor 110 may be formed by appropriate changes in polarities of dopants, and may also be formed with either a p-type conductivity semiconductor material 104 or an n-type conductivity semiconductor material 104.

Elements of field oxide 112 may be disposed at the top surface of the substrate 102 to laterally isolate the analog MOS transistor 106 and the extended drain MOS transistor 110. Additional elements of field oxide 112 may be disposed at the top surface of the substrate 102 in the extended drain MOS transistor 110.

The analog MOS transistor 106 includes a gate 114 disposed over a gate dielectric layer 116 disposed over the substrate 102. The analog MOS transistor 106 further includes p-type source/drain regions 118 disposed in the substrate 102 adjacent to and extending partway under the gate 114. The analog MOS transistor 106 is free of p-type source/drain extensions and n-type halo regions as may be found on p-channel logic transistors. The analog MOS transistor 106 is formed in an n-type well 120 disposed in the substrate 102 which includes two diluted regions 122 under edges of the gate 114. A central region 124 of the well 120 between the two diluted regions 122 has a higher average n-type doping density than the two diluted regions 122. The source/drain regions 118 extend into the two diluted regions 122 but do not extend into the central region 124. The doping density of the central region 124 affects a threshold voltage of the analog MOS transistor 106, in combination with a thickness and dielectric constant of the gate dielectric layer 116, a work function of the gate 114 and other parameters. The well 120 is formed so as to provide a desired doping density in the central region 124 which in turn advantageously provides a desired threshold voltage. The doping density of the two diluted regions 122 determines lateral extents of the source/drain regions 118 under the gate 114. The well 120 is formed so as to provide a desired doping density in the two diluted regions 122 which in turn provides desired lateral extents of the source/drain regions 118 under the gate 114. The lateral extents of the source/drain regions 118 under the gate 114 advantageously contribute to a desired level of reliability of the analog MOS transistor 106, for example reliability from CHC failure.

The logic MOS transistor 108 includes a gate 126 disposed over a gate dielectric layer 128 disposed over the substrate 102. The gate 126 and the gate dielectric layer 128 of the logic MOS transistor 108 may have similar thickness and composition as the gate 114 and the gate dielectric layer 116 of the analog MOS transistor 106. The logic MOS transistor 108 further includes p-type source/drain regions 130 with p-type source/drain extensions 132 and n-type halo regions 134 adjacent to the source/drain extensions 132. The source/drain regions 130 of the logic MOS transistor 108 have the same p-type dopants and similar doping distributions as the source/drain regions 118 of the analog MOS transistor 106. The logic MOS transistor 108 is disposed in an n-type well 136 which may have the same n-type dopants with a similar doping distribution as the well 120 containing the analog MOS transistor 106. In one version of the instant example, the well 136 containing the logic MOS transistor 108 may be continuous with the well 120 containing the analog MOS transistor 106.

The extended drain MOS transistor 110 includes a gate 138 disposed over a gate dielectric layer 140 disposed over the substrate 102. The gate 138 and the gate dielectric layer 140 of the extended drain MOS transistor 110 may have similar thickness and composition as the gate 114 and the gate dielectric layer 116 of the analog MOS transistor 106. The gate 138 overlaps a portion of an element of the field oxide 112 in a drain side of the extended drain MOS transistor 110. The extended drain MOS transistor 110 further includes an n-type extended drain region 142 in the substrate 102 which has a substantially equivalent depth and average doping density as the well 120 containing the analog MOS transistor 106. The extended drain region 142 extends partway under the gate 138 and under the element of the field oxide 112 in the drain side and up to an n-type drain contact region 144 at the top surface of the substrate 102. The extended drain MOS transistor 110 includes a p-type body region 146 disposed in the substrate adjacent to the extended drain region 142 and extending partway under the gate 138 and up to a p-type body contact region 148 at the top surface of the substrate 102 on a source side of the extended drain MOS transistor 110. The body region 146 may be laterally separated from the extended drain region 142 as depicted in FIG. 1, or may abut the extended drain region 142. The extended drain MOS transistor 110 includes an n-type source region 150 adjacent to the gate 138 disposed in the p-type body region 146. The source region 150 may include an n-type source extension 152 which extends partway under the gate 138.

Gate sidewall spacers 154 may be disposed on lateral surfaces of the gate 114 of the analog MOS transistor 106, the gate 126 of the logic MOS transistor 108 and the gate 138 of the extended drain MOS transistor 110. The gate sidewall spacers 154 may include one or more layers of silicon dioxide and/or silicon nitride. The gate sidewall spacers 154 may be, for example, 20 nanometers to 100 nanometers wide at the top surface of the substrate 102.

The integrated circuit 100 includes a pre-metal dielectric (PMD) layer 156 disposed over the substrate 102 and over the analog MOS transistor 106, the logic MOS transistor 108 and the extended drain MOS transistor 110. The PMD layer 156 may include, for example, a dielectric layer stack including a silicon nitride or silicon dioxide PMD liner 10 to 100 nanometers thick deposited by plasma enhanced chemical vapor deposition (PECVD), a main layer of silicon dioxide, phosphorus-silicate glass (PSG) or boron-phosphorus-silicate glass (BPSG), 300 to 2000 nanometers thick and deposited by PECVD, commonly leveled by a chemical-mechanical polish (CMP) process, and an optional PMD cap layer, 10 to 100 nanometers of a hard material such as silicon nitride, silicon carbide nitride or silicon carbide.

Contacts 158 are disposed through the PMD layer 156 so as to make electrical connections to the source/drain regions 118 of the analog MOS transistor 106, the source/drain regions 130 of the logic MOS transistor 108, and the drain contact region 144, the source region 150 and the body contact region 148 of the extended drain MOS transistor 110. There may be metal silicide disposed at top surfaces of the source/drain regions 118, the source/drain regions 130, the drain contact region 144, the source region 150 and the body contact region 148 to improve the electrical connections to the contacts 158.

Figure 2A:
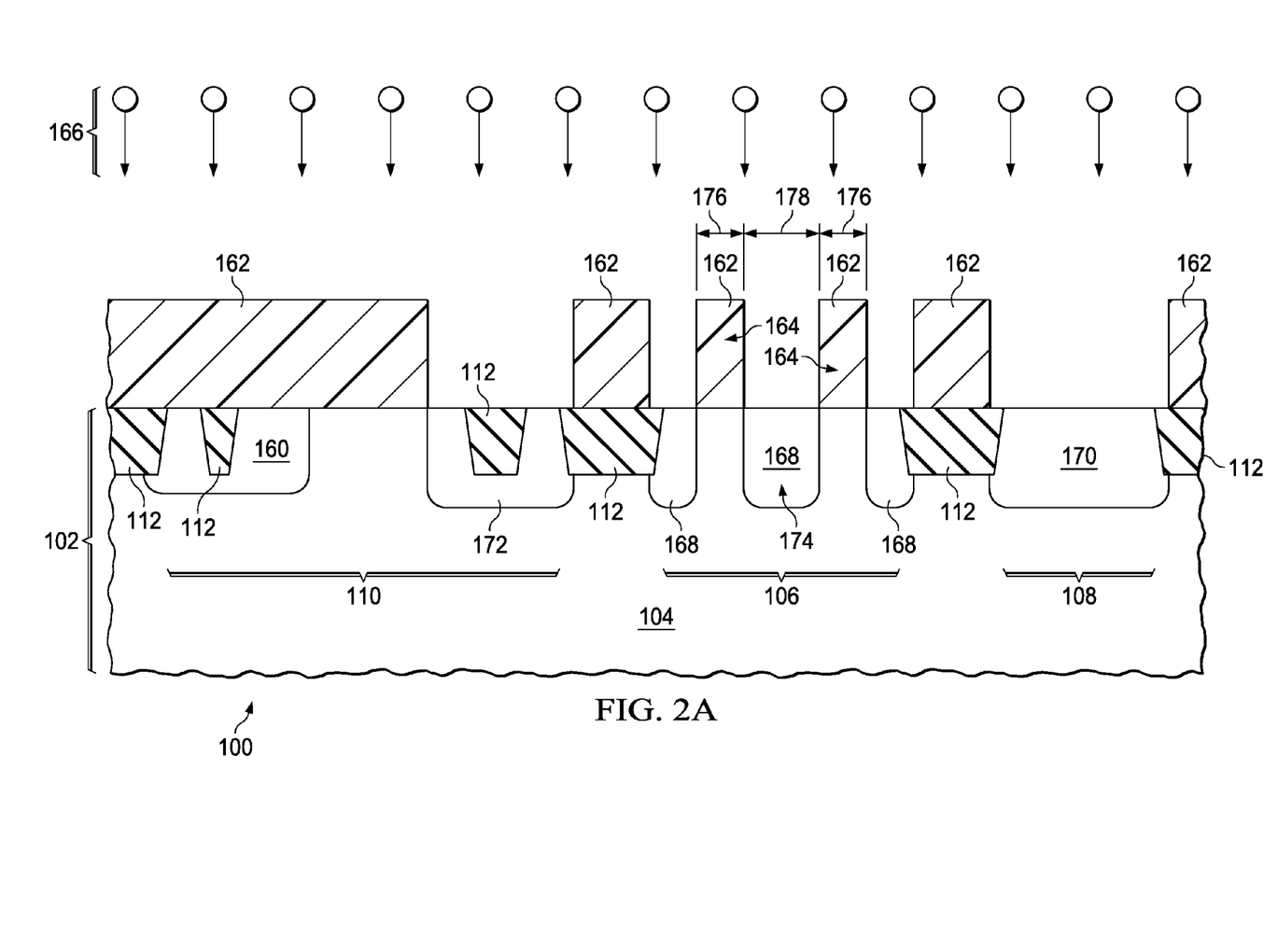
FIG. 2A through FIG. 2G are cross sections of the integrated circuit of FIG. 1, depicted in successive stages of fabrication.

FIG. 2A through FIG. 2G are cross sections of the integrated circuit of FIG. 1, depicted in successive stages of fabrication. Referring to FIG. 2A, the substrate 102 may be a uniformly doped single crystal silicon wafer, a silicon-on-insulator (SOI) wafer, a heavily doped silicon wafer with a silicon epitaxial layer at the top surface of the substrate 102, or other material appropriate for forming the integrated circuit 100. The field oxide 112 and 112 may be formed by a shallow trench isolation (STI) process, by a local oxidation of silicon (LOCOS) process or other field oxide formation method. A body implanted region 160 containing p-type dopants such as boron is formed in the substrate 102 in an area for the p-type body region 146 of the extended drain MOS transistor 110 of FIG. 1.

An implant mask 162 is formed over the substrate 102 which exposes an area for implanting the extended drain region 142 and an area for implanting the well 120 of FIG. 1. The implant mask 162 includes blocking geometries 164 over the diluted regions 122 of FIG. 1. N-type dopants 166 such as phosphorus, arsenic and possibly antimony are implanted into the substrate 102 in the areas exposed by the implant mask 162 to form an analog well implanted region 168 in the analog MOS transistor 106, a logic well implanted region 170 in the logic MOS transistor 108, and an extended drain implanted region 172 in the extended drain MOS transistor 110 and. Example implant parameters may include implanting phosphorus at a dose of $6 \times 10^{12}$ cm$^{-2}$ to $4 \times 10^{13}$ cm$^{-2}$ and an energy of 120 keV to 200 keV, and implanting arsenic at a dose of $3 \times 10^{12}$ cm$^{-2}$ to $8 \times 10^{13}$ cm$^{-2}$ and an energy substantially equal to that of the phosphorus, for a total dose of the n-type dopants 166 is $9 \times 10^{12}$ cm$^{-2}$ to $1.2 \times 10^{14}$ cm$^{-2}$. The blocking geometries 164 block the dopants 166 from the substrate 102. The analog well implanted region 168 includes a central implanted region 174 between the blocking geometries 164. Widths 176 of the blocking geometries 164 and a width 178 between the blocking geometries 164 are selected to provide desired doping densities in the two diluted regions 122 and the central region 124 of FIG. 1. For example, the widths 176 of the blocking geometries 164 may be 0.4 microns to 0.6 microns, and the width 178 between the blocking geometries 164 may be 0.6 microns to 0.8 microns. The implant mask 162 is subsequently removed, for example using an asher process followed by a wet clean using an aqueous mixture of sulfuric acid and hydrogen peroxide.

Figure 2B:
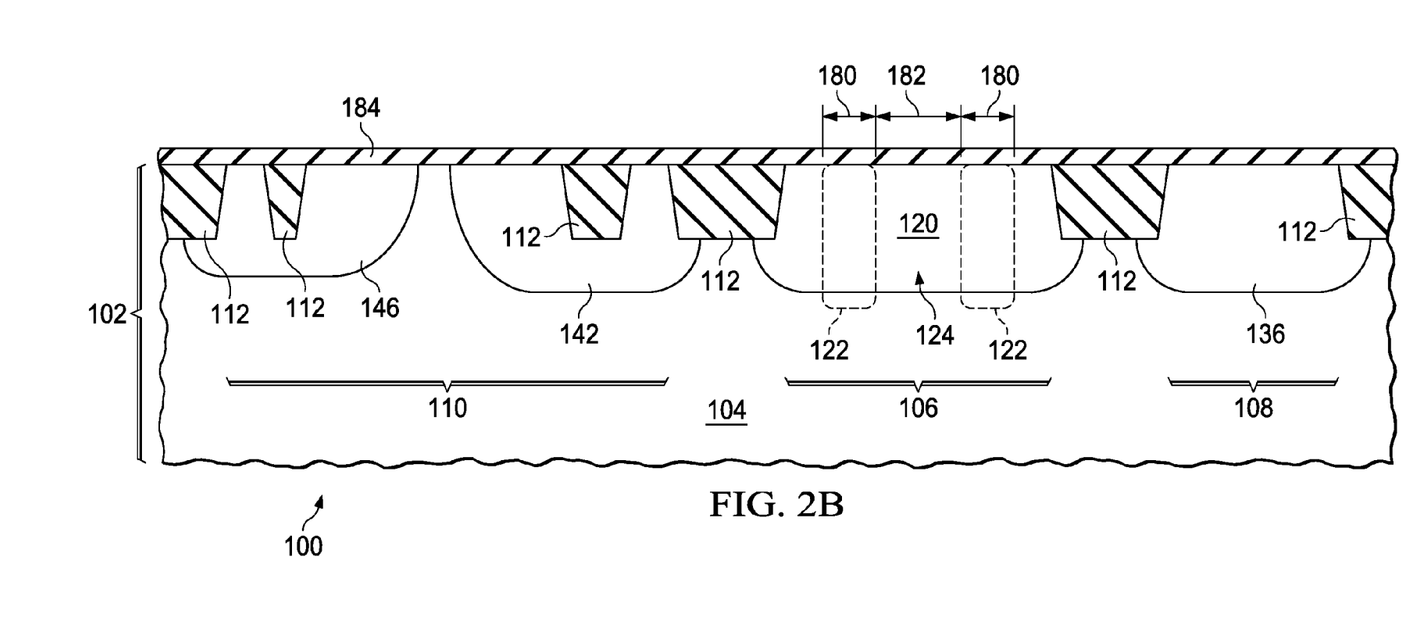

Referring to FIG. 2B, a thermal drive process is performed which heats the substrate 102 so as to diffuse and activate the implanted p-type dopants in the body implanted region 160 and the implanted n-type dopants in the analog well implanted region 168, the logic well implanted region 170 and the extended drain implanted region 172 of FIG. 2A, so as to form the p-type body region 146, the n-type well 120 of the analog MOS transistor 106, the n-type well 136 of the logic MOS transistor 108, and the n-type extended drain region 142, respectively. The well 120 is continuous across the two diluted regions 122. Widths 180 of the two diluted regions 122 and a width 182 of the central region 124 are substantially equal to the widths 176 of the blocking geometries 164 and the width 178 between the blocking geometries 164 of FIG. 2A, respectively. Using the example described in reference to FIG. 2A, the widths 180 of the two diluted regions 122 would be 0.4 microns to 0.6 microns, and the width 182 of the central region 124 would be 0.6 microns to 0.8 microns. A thermal profile of the thermal drive process is selected to provide doping densities in the two diluted regions 122 and in the central region 124, as described in reference to FIG. 1. An example thermal profile for the thermal drive process may include heating the substrate 102 to a temperature of 1150° C. for 4 hours or equivalent anneal conditions, for example, 1200° C. for 1.5 hours, or 1100° C. for 12 hours.

The top surface of the substrate 102 may possibly be protected during the thermal drive process by a sacrificial layer 184 of thermally grown silicon dioxide which is formed early in the thermal drive process. The sacrificial layer 184 may be subsequently removed, for example by a wet etch in an aqueous buffered solution of dilute hydrofluoric acid.

Figure 2C:
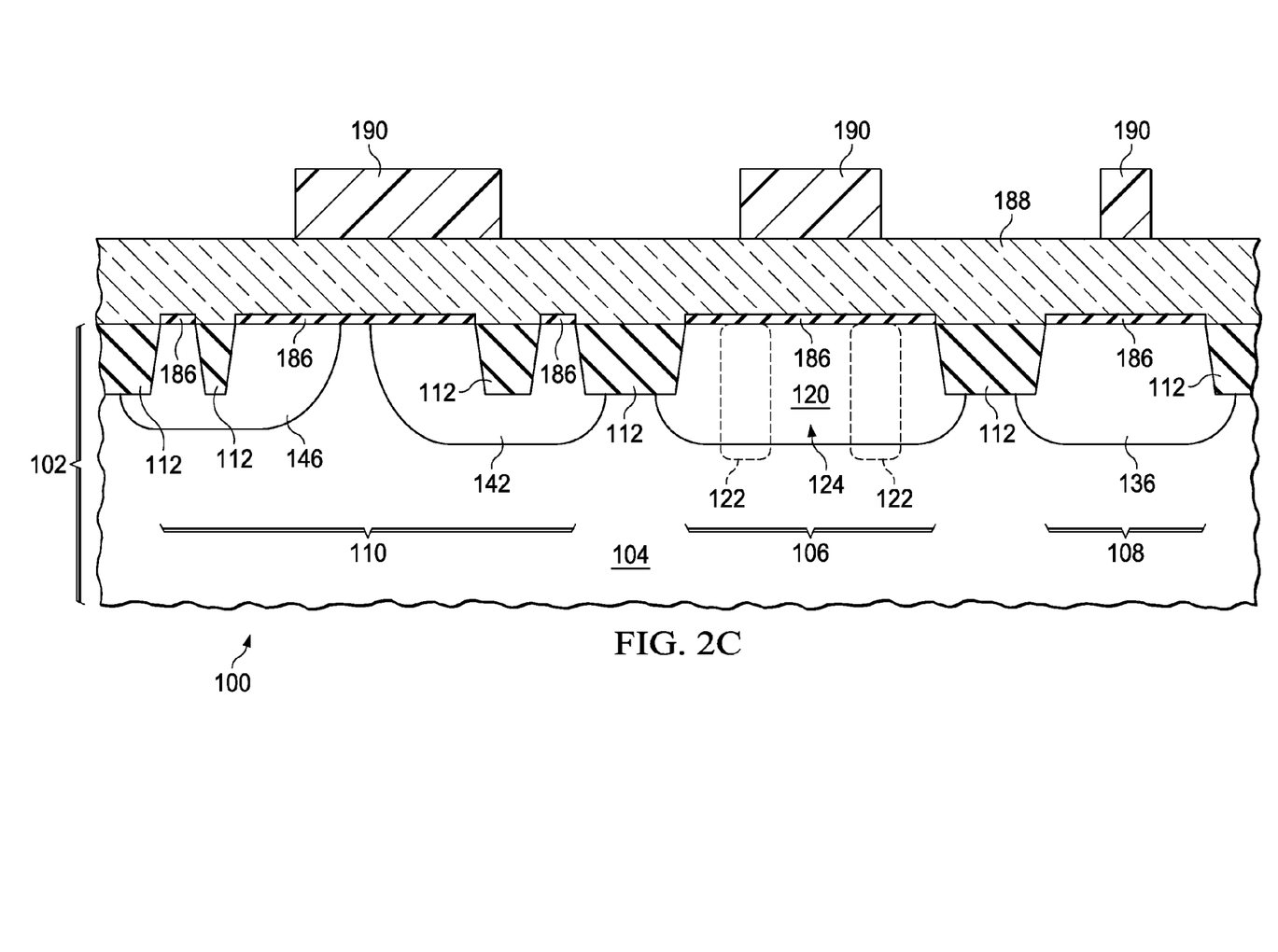

Referring to FIG. 2C, a layer of gate dielectric material 186 is formed at the top surface of the substrate 102. The layer of gate dielectric material 186 may include thermally grown silicon dioxide, silicon nitride, silicon oxy-nitride and/or high-k dielectric material such as hafnium oxide, zirconium oxide or tantalum oxide. The layer of gate dielectric material 186 may be, for example, 12 nanometers to 13 nanometers thick for a gate operating voltage of 5 volts, or may be 26 nanometers to 30 nanometers thick for a gate operating voltage of 10 volts. The logic MOS transistor 108 may have the same layer of gate dielectric material 186 as the analog MOS transistor 106 as depicted in FIG. 2C, or may have a thinner layer of gate dielectric material for efficient operation at a lower voltage. A layer of gate material 188 such as polycrystalline silicon, commonly referred to as polysilicon, is formed over the layer of gate dielectric material 186. The layer of gate material 188 may be, for example, 100 nanometers to 1000 nanometers thick.

A gate etch mask 190 is formed over the layer of gate material 188 so as to cover areas for the gate 114 of the analog MOS transistor 106, the gate 126 of the logic MOS transistor 108, and the gate 138 of the extended drain MOS transistor 110 of FIG. 1. The gate etch mask 190 extends partway over the two diluted regions 122. An extent of overlap of the gate etch mask 190 with the two diluted regions 122 is selected to provide the desired lateral extents of the source/drain regions 118 under the gate 114 as discussed in reference to FIG. 1. The gate etch mask 190 may include photoresist formed by a photolithographic process, and/or may include hard mask material such as silicon nitride or amorphous carbon.

Figure 2D:
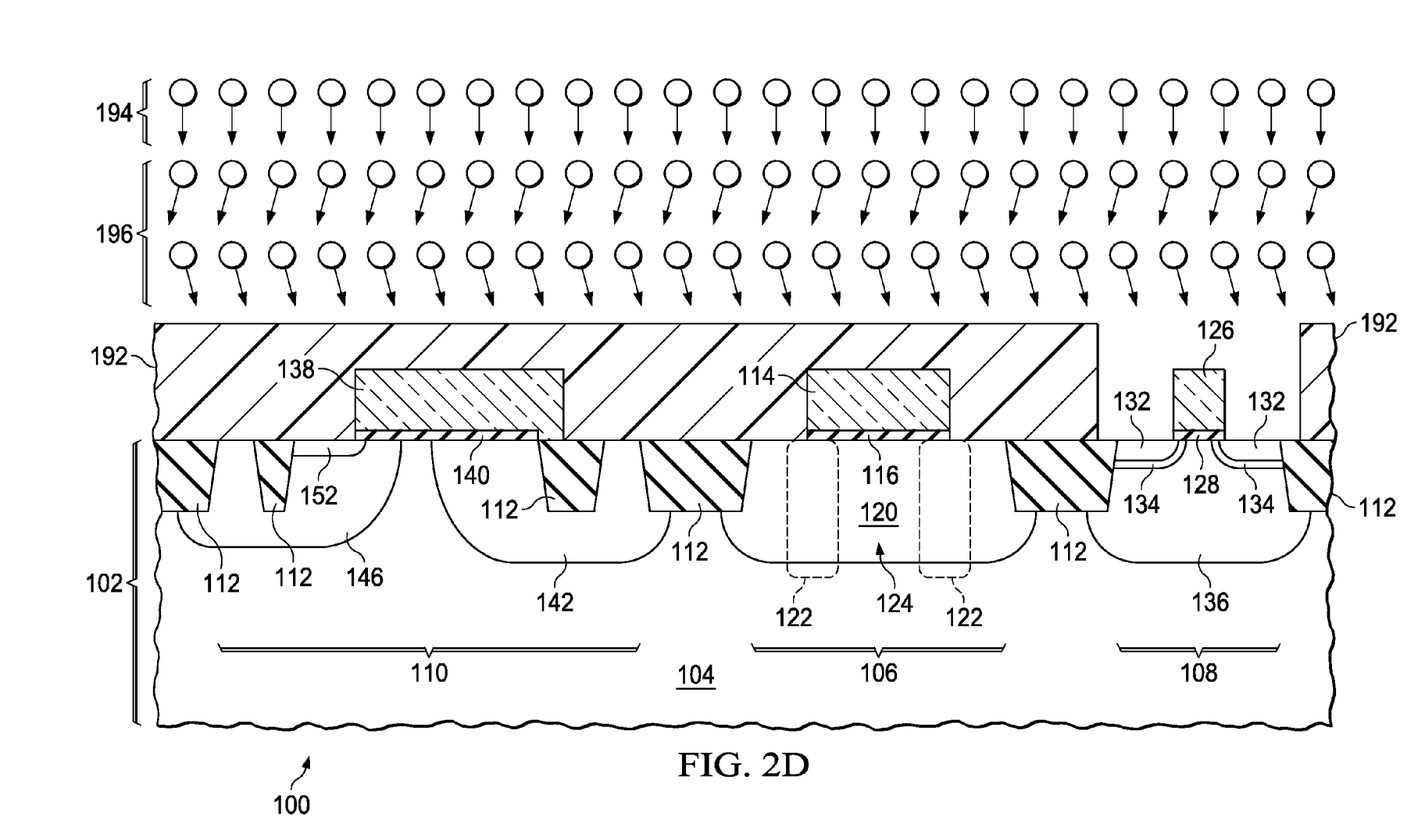

Referring to FIG. 2D, the layer of gate material 188 is removed in areas exposed by the gate etch mask 190 of FIG. 2C to form the gate 114 of the analog MOS transistor 106, the gate 126 of the logic MOS transistor 108, and the gate 138 of the extended drain MOS transistor 110. The layer of gate dielectric material 186 under the gates 114, 126 and 126 forms the gate dielectric layer 116 of the analog MOS transistor 106, the gate dielectric layer 128 of the logic MOS transistor 108, and the gate dielectric layer 116 of the extended drain MOS transistor 110, respectively.

The n-type source extension 152 is formed by implanting n-type dopants such as phosphorus and/or arsenic at a total dose of $1 \times 10^{12}$ cm$^{-2}$ to $1 \times 10^{14}$ cm$^{-2}$ into the substrate adjacent to the gate 138 on the source side of the extended drain MOS transistor 110. An implant mask 192 is formed over an existing top surface of the integrated circuit 100 which exposes the logic MOS transistor 108 and covers the analog MOS transistor 106 and the extended drain MOS transistor 110. P-type dopants 194 such as boron are implanted into the substrate 102 adjacent to the gate 126 of the logic MOS transistor 108 to form the source/drain extensions 132. N-type dopants 196 such as phosphorus and possibly arsenic are implanted at an angle into the substrate 102 adjacent to the source/drain extensions 132 to form the halo regions 134. The implant mask 192 blocks the p-type dopants 194 and n-type dopants 196 from the analog MOS transistor 106. The implant mask 192 is removed after the p-type dopants 194 and n-type dopants 196 are implanted. The substrate 102 is subsequently annealed to activate the implanted p-type dopants 194 and n-type dopants 196.

Figure 2E:
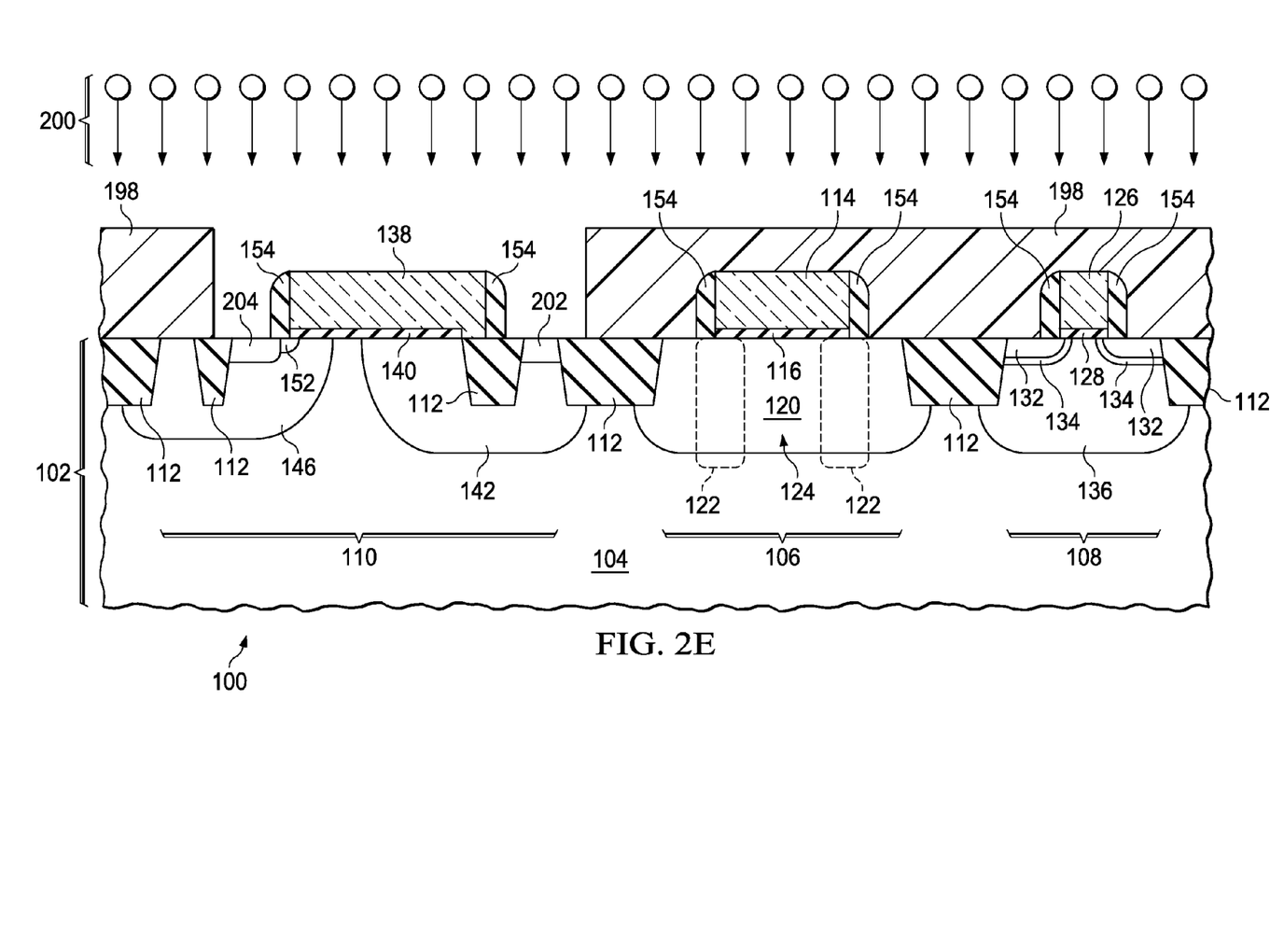

Referring to FIG. 2E, the gate sidewall spacers 154 are formed by forming a conformal layer of spacer dielectric material over the gates 114, 126 and 138 and over the substrate 102. The layer of spacer dielectric material may include, for example, one or more sublayers of silicon nitride and/or silicon dioxide. The layer of spacer dielectric material is anisotropically etched to remove the spacer dielectric material from horizontal surfaces of the gates 114, 126 and 138 and over the substrate 102 to leave the spacer dielectric material on the lateral surfaces of the gates 114, 126 and 138, thus forming the gate sidewall spacers 154.

An n-channel source/drain (NSD) implant mask 198 is formed over an existing top surface of the integrated circuit 100 which exposes areas for the drain contact region 144 and the source region 150 of the extended drain MOS transistor 110 of FIG. 1. N-type dopants 200 such as phosphorus and arsenic are implanted into the substrate 102 in the areas exposed by the NSD implant mask 198 to form a drain contact implanted region 202 and a source implanted region 204 in the extended drain MOS transistor 110. A total dose of the n-type dopants 200 may be, for example, $1 \times 10^{14}$ cm$^{-2}$ to $3 \times 10^{15}$ cm$^{-2}$. The NSD implant mask 198 is removed after the n-type dopants 200 are implanted.

Figure 2F:
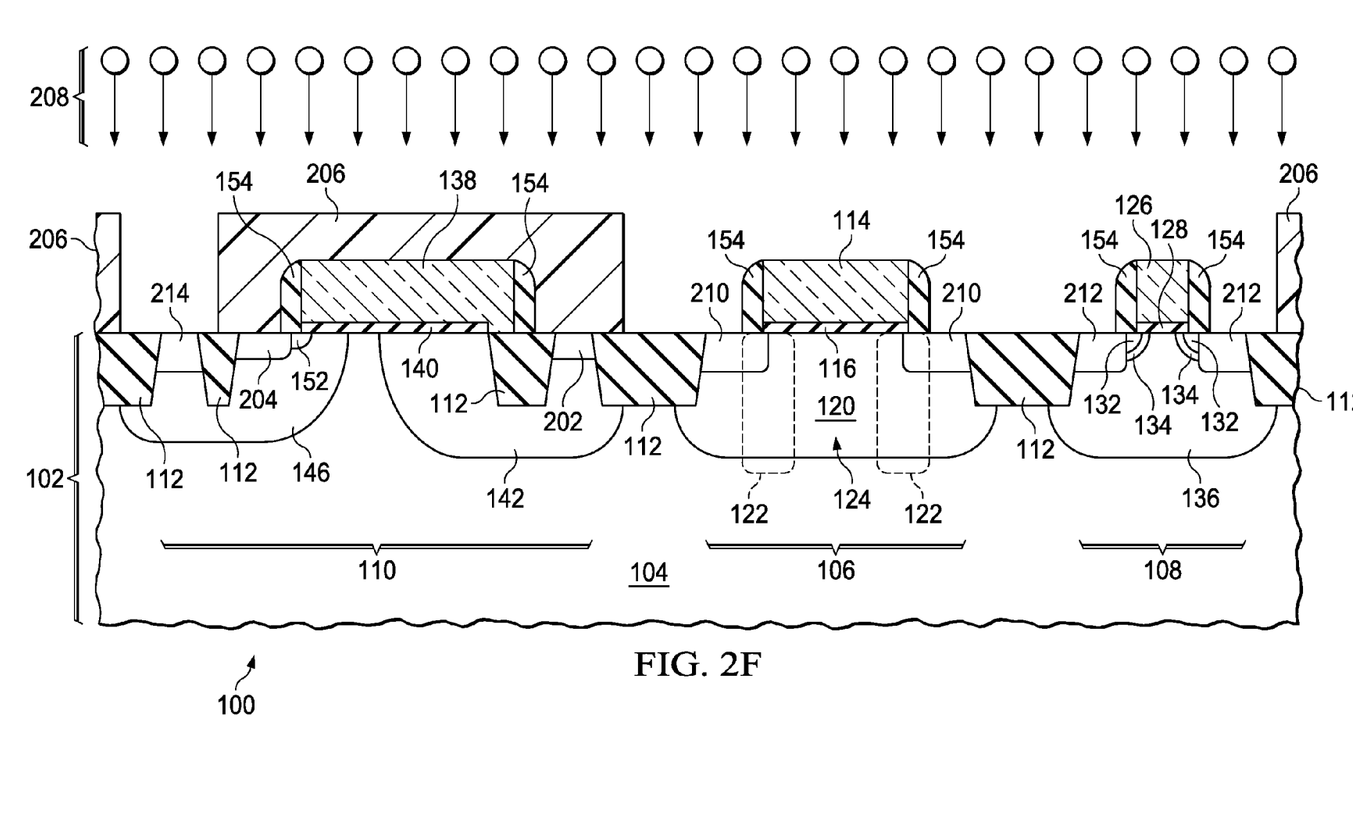

Referring to FIG. 2F, a p-channel source/drain (PSD) implant mask 206 is formed over an existing top surface of the integrated circuit 100 which exposes areas for the source/drain regions 118 of the analog MOS transistor 106, for the source/drain regions 130 of the logic MOS transistor 108, and for the body contact region 148 of the extended drain MOS transistor 110 of FIG. 1. P-type dopants 208 such as boron are implanted into the substrate 102 in the areas exposed by the PSD implant mask 206 to form source/drain implanted regions 210 in the analog MOS transistor 106, source/drain implanted regions 212 in the logic MOS transistor 108, and a body contact implanted region 214 in the extended drain MOS transistor 110. A total dose of the p-type dopants 208 may be, for example, $3 \times 10^{14}$ cm$^{-2}$ to $3 \times 10^{15}$ cm$^{-2}$. A portion of the p-type dopants 208 are scattered into the two diluted regions 122 under the gate 114. The PSD implant mask 206 is removed after the p-type dopants 208 are implanted. Implanting the p-type dopants 208 concurrently to form the source/drain regions 118 of the analog MOS transistor 106 and the source/drain regions 130 of the logic MOS transistor 108 may advantageously reduce the fabrication cost compared to a process sequence of implanting p-type dopants separately.

Figure 2G:
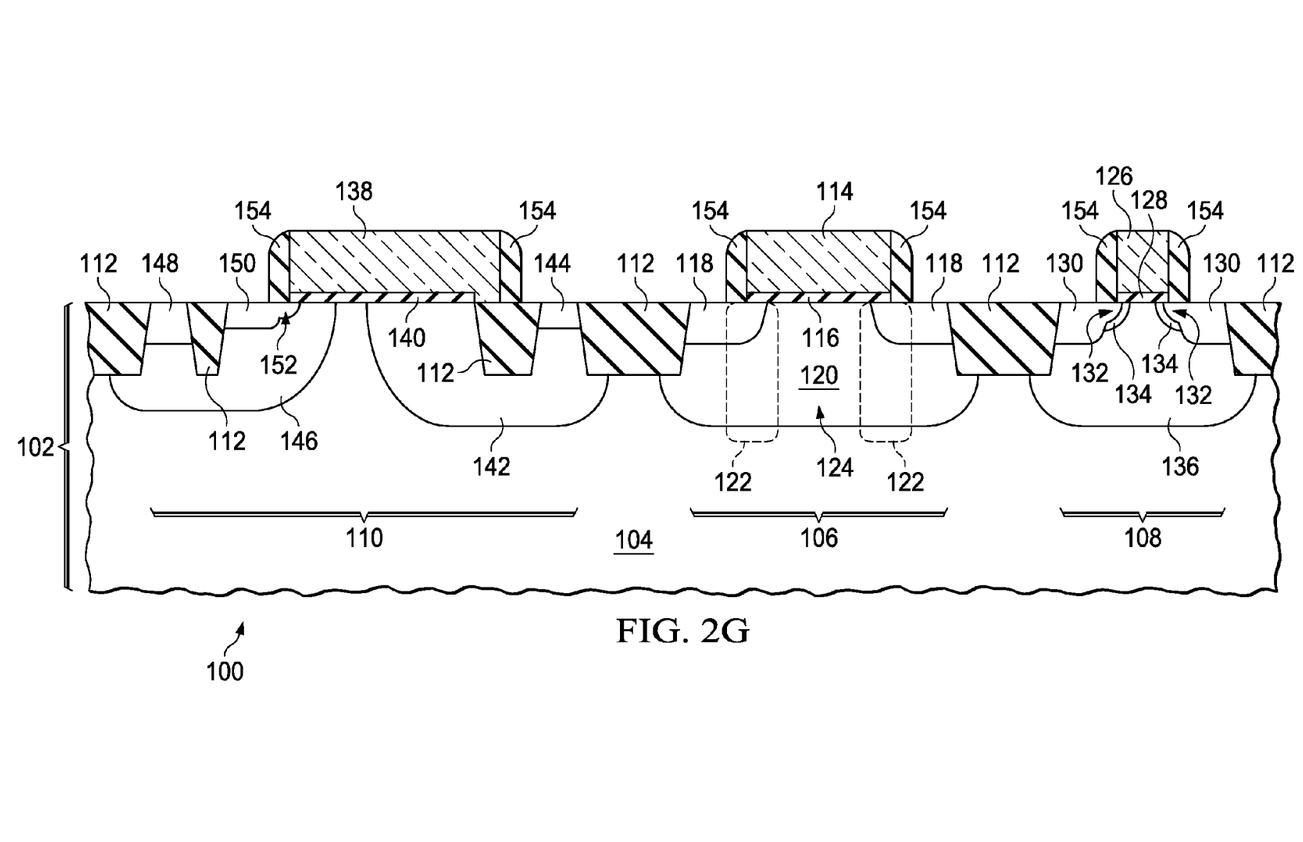

Referring to FIG. 2G, an anneal operation is performed which heats the substrate 102 with a short-time thermal profile, that is, less than 60 seconds, to activate the n-type dopants in the drain contact implanted region 202 and the source implanted region 204 and the p-type dopants in the source/drain implanted regions 210, the source/drain implanted regions 212 and the body contact implanted region 214 of FIG. 2F to form the n-type drain contact region 144 and the n-type source region 150 and the p-type source/drain regions 118, the p-type source/drain regions 130 and the p-type body contact region 148, respectively. An example thermal profile for the anneal operation may include heating the substrate 102 to a temperature of 1000° C. to 1050° C. for 15 seconds to 30 seconds. The low doping density in the two diluted regions 122 advantageously results in a longer extension of the source/drain regions 118 under the gate 114 during the anneal operation whose thermal profile is selected to provide limited expansion of the n-type source region 150. Subsequently, the PMD layer 156 and contacts 158 are formed to produce the structure of FIG. 1.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a substrate comprising semiconductor material; and
   an analog metal oxide semiconductor (MOS) transistor, comprising:
      a well having a first conductivity type disposed in said substrate, said well including two diluted regions and a central region disposed between said two diluted regions, wherein an average doping density of said central region is higher than average doping densities of said two diluted regions;
      a gate dielectric layer disposed over said well at a top surface of said substrate;
      a gate disposed over said gate dielectric layer, such that said two diluted regions are disposed under edges of said gate; and
      source/drain regions having a second, opposite, conductivity type disposed in said substrate adjacent to and extending partway under said gate, so that said source/drain regions extend into said two diluted regions but do not extend into said central region;
      said analog MOS transistor being free of source/drain extensions having said second conductivity type and halo regions having said first conductivity type.

2. The integrated circuit of claim 1, further comprising an extended drain MOS transistor having an opposite polarity from said analog MOS transistor, said extended drain MOS transistor including an extended drain region of said first conductivity type, said extended drain region having a substantially equivalent depth and average doping density as said central region of said well.

3. The integrated circuit of claim 1, further comprising a logic MOS transistor having the same polarity as said analog MOS transistor, said logic MOS transistor including source/drain regions of said second conductivity type, said source/drain regions of said logic MOS transistor having the same dopants and a similar doping distribution as said source/drain regions of said analog MOS transistor.

4. The integrated circuit of claim 1, wherein said first conductivity type is n-type and said second conductivity type is p-type.

5. The integrated circuit of claim 1, wherein said first conductivity type is p-type and said second conductivity type is n-type.

6. The integrated circuit of claim 1, wherein said semiconductor material of said substrate has said p-type conductivity type.

7. The integrated circuit of claim 1, wherein said two diluted regions are 0.4 microns to 0.6 microns wide and said central region is 0.6 microns to 0.8 microns wide.

* * * * *